United States Patent [19]

Okatani et al.

[11] 4,237,373

[45] Dec. 2, 1980

[54] MAGNETIC TAPE RUNNING STATE AND TAPE RUN AMOUNT DISPLAY DEVICE

[75] Inventors: Masanao Okatani; Hiroshi Onishi; Yoshiaki Ishibashi; Reisuke Sato; Hisashi Suganuma; Tomohisa Yokogawa; Yoshiharu Ueki; Haruo Kama; Tadashi Kosuga; Tadashi Ogawa, all of Kawagoe, Japan

[73] Assignee: Pioneer Electronic Corporation, Tokyo, Japan

[21] Appl. No.: 937,899

[22] Filed: Aug. 29, 1978

[30] Foreign Application Priority Data

Aug. 30, 1977 [JP] Japan .................................. 52/103985
Aug. 30, 1977 [JP] Japan .................................. 52/103987

[51] Int. Cl.$^3$ ............................................ G06M 3/06
[52] U.S. Cl. .......................... 235/92 EV; 235/92 EA; 235/92 MP; 235/92 R; 340/762
[58] Field of Search ....... 235/92 MP, 92 DN, 92 EV, 235/92 CC, 92 EA, 92 GC, 103, 103.5, 104; 360/72.1, 72.3, 74.2, 90, 137; 340/75, 762, 782

[56] References Cited

U.S. PATENT DOCUMENTS

| | | | |
|---|---|---|---|
| 3,602,698 | 8/1971 | Vigour | 235/92 GC |
| 3,729,621 | 4/1973 | Taisne | 235/92 GC |
| 3,982,107 | 9/1976 | Butler | 235/92 DN |
| 4,092,680 | 5/1978 | Sander | 360/72.3 |
| 4,140,896 | 2/1979 | Robertson | 235/92 SH |
| 4,151,566 | 4/1979 | Ohrman | 360/72.1 |

*Primary Examiner*—Leo H. Boudreau
*Attorney, Agent, or Firm*—Sughrue, Rothwell, Mion, Zinn and Macpeak

[57] ABSTRACT

The present invention is a magnetic tape running state and tape run amount display device which displays visually the running direction and speed or the run amount and direction of the magnetic tape. An up-down counter is provided with a clock input signal having a pulse generated in correspondence with the run of the tape and is also provided with a count control signal. The count control signal has an UP signal generated when the tape is being transported in a first or forward direction, and has a DOWN signal generated when the tape is being transported in a second or reverse direction. The up-down counter provides a binary output count signal to a display circuit in correspondence with the clock input signal and the count control signal. The up-down counter can also be provided with a reset input responsive to a reset signal which acts to reset the count back to logic 0. The display circuit provides a visual representation of the binary output signal, and may include a first binary-to-digital decoder and a second binary-to-digital decoder, each being responsive to a preselected portion of the binary bits provided by the up-down counter. A plurality of light emitting diodes are connected between decimal output lines of the first and second binary-to-digital decoders for providing a visual indication of the tape running state and run amount. In one arrangement, the diodes are arranged to define a line. The display circuit also can be responsive to the binary tuning signal provided by an electronic tuning type receiver.

12 Claims, 3 Drawing Figures

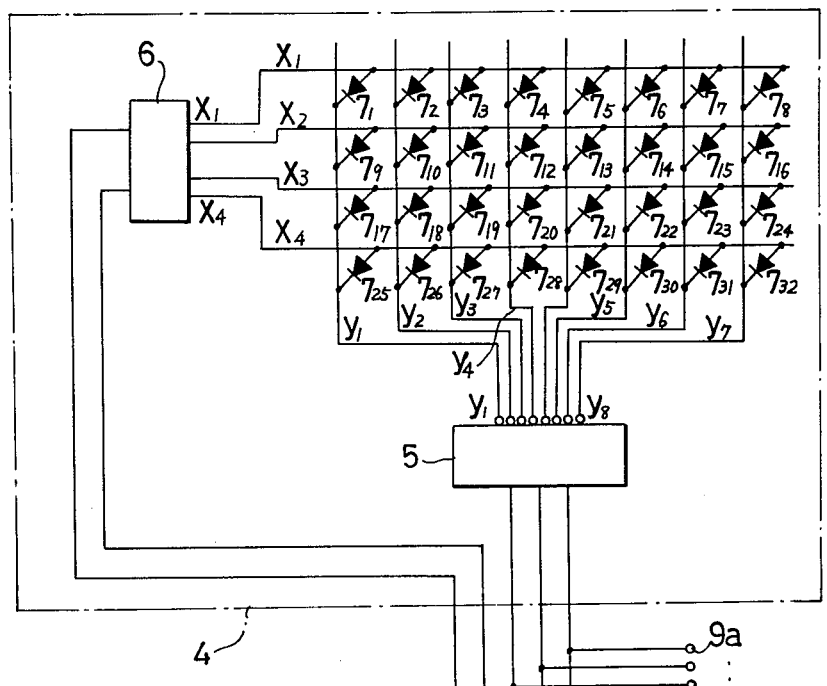
FIG.1
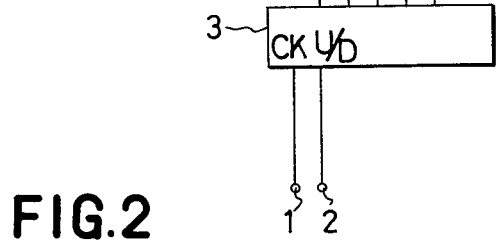
FIG.2
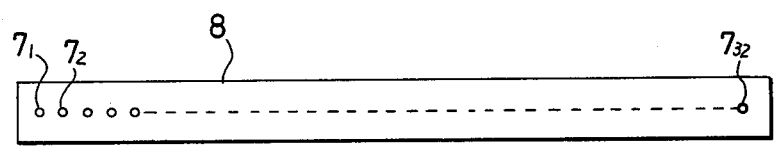

MAGNETIC TAPE RUNNING STATE AND TAPE RUN AMOUNT DISPLAY DEVICE

BACKGROUND OF THE INVENTION

1. Field of the Invention

The present invention relates to a magnetic tape running state and tape run amount display device which usually displays the running direction, the running speed, and the amount of run of a magnetic tape.

2. Description of the Prior Art

In a tape recorder, a magnetic tape is run in a first or forward direction at a constant speed for recording and playing, and is run in a second or reverse direction at a higher speed for rewinding. In these tape transport operations, the tape running state is important for proper operation and should be carefully monitored at all times. Moreover, a counter is typically provided in a conventional tape recorder to indicate the amount of run of the magnetic tape. The amount of run of the magnetic tape, or the amount of the remaining length of tape can be determined by reading the counter.

With respect to tape running direction and speed, a conventional tape recorder of the cassette tape type often provides a visual indication of the direction and speed through the use of openings coincident with the small transparent window of the cassette housing. However, the transparent window cannot be observed visually unless the user can see the window, which is often impossible when the user is removed from the tape recorder.

One conventional approach for providing a visual indication of the running direction and speed as well as the amount of run of the magnetic tape is the mechanical digital counter, which is coupled to the open reel or cassette reel and which moves a counter element in accordance with the rotation of the open or cassette reel. A numerical scale on the counter element provides a visual indication of the amount of run or the remaining amount of magnetic tape. The running direction and speed is provided by the direction and speed of movement of the counter element.

Such a conventional mechanical digital counter, however, exhibits several major deficiencies. Because the digital counter must be mechanically coupled to the open reel or cassette reel, the position of the counter in the tape recorder is limited, and the amount of required space especially along the surface of the tape recorder housing is great. In addition, because the operation of the counter is slow and intermittent, it is difficult to determine quickly and accurately the direction and speed of the tape.

SUMMARY OF THE INVENTION

The present invention is a magnetic tape running state and tape run amount display device which displays visually the running direction and speed or the run amount and direction of the magnetic tape. An up-down counter is provided with a clock input signal having a pulse generated in correspondence with the run of the tape and is also provided with a count control signal. The count control signal has an UP signal generated when the tape is being transported in a first or forward direction, and has a DOWN signal generated when the tape is being transported in a second or reverse direction. The up-down counter provides a binary output count signal to a display circuit in correspondence with the clock input signal and the count control signal. The up-down counter can also be provided with a reset input responsive to a reset signal which acts to reset the count back to logic 0. The display circuit provides a visual representation of the binary output signal, and may include a first binary-to-digital decoder and a second binary-to-digital decoder, each being responsive to a preselected portion of the binary bits provided by the up-down counter. A plurality of light emitting diodes are connected between decimal output lines of the first and second binary-to-digital decoders for providing a visual indication of the tape running state and run amount. In one arrangement, the diodes are arranged to define a line. The display circuit also can be responsive to the binary tuning signal provided by an electronic tuning type receiver.

BRIEF DESCRIPTION OF THE DRAWINGS

FIG. 1 is a block circuit diagram showing one example of the magnetic tape running state and tape run amount display device of the present invention which displays visually the running direction and speed of the magnetic tape;

FIG. 2 is a plan view showing an arrangement of the light emitting diodes shown in FIG. 1.

DETAILED DESCRIPTION OF THE INVENTION

Figure 3:
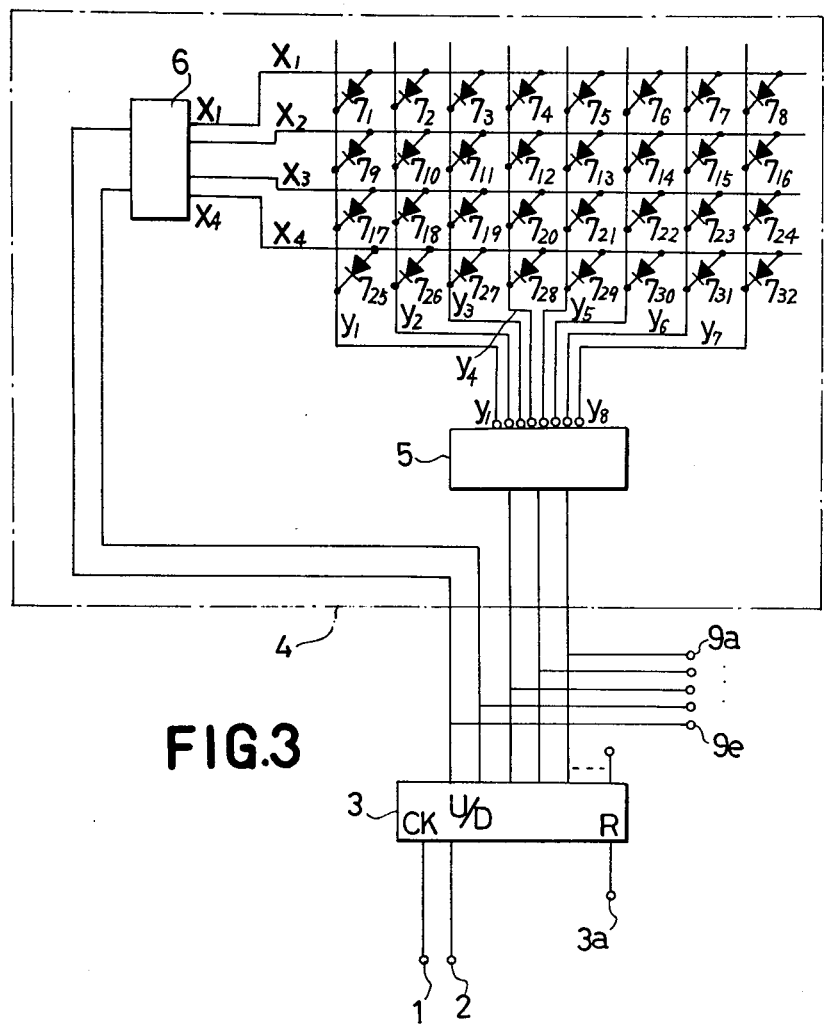
FIG. 3 is a block diagram showing one example of the magnetic tape running state and tape run amount display device of the present invention which displays visually the run amount and direction of the magnetic tape.

The present invention is now described in detail with reference to the accompanying drawings.

One example of the magnetic running state and tape run amount display device of the present invention which visually displays the running direction and speed of the magnetic tape is shown in FIG. 1.

Referring now to FIG. 1, reference numeral 1 designates a first input terminal to which an output signal of a sensing circuit (not shown) is applied. The sensing circuit operates to detect the rotation of an open reel, cassette reel, or the like, and provides an output sensing signal having information corresponding to the rotation of the reel being sensed. For example, the sensing circuit provides a pulse on the output sensing signal each time the reel is rotated one complete revolution. Reference numeral 2 designates a second input terminal to which a count control signal is applied. The count control signal is, for example, a high level or UP signal when the magnetic tape mechanism (not shown) is in the forward play, the forward record, or the fast-forward modes of operation, for example, and is a low level or DOWN signal when the magnetic tape mechanism is in the reverse rewind mode of operation, for example. Reference numeral 3 designates a serial-to-parallel up-down counter which receives as a clock (CK) input the sensing signal applied to the first input terminal 1, and receives as an up/down (U/D) input the count control signal applied to the second input terminal 2. Counter 3 provides in parallel fashion an output signal corresponding to the sum of the count control signal. For purposes of explanation, counter 3 has a five (5) bit output capability, but it should be noted that counter 3 can have a larger or a smaller bit output capacity. It should also be noted that it is possible to use in the present invention only some of the bit outputs provided by counter 3. Thus, counter 3 can provide more bit outputs than are used. In addition, counter 3 can be one of the many commercially available serial-to-parallel counters.

Reference numeral 4 designates generally a display circuit of the present invention. Display circuit 4 is adapted to display the parallel binary bit count output of the up-down counter 3. The display circuit 4 includes a first decoder 5, a second decoder 6, and a plurality of visual display devices $7_1$ to $7_{MAX}$. The first decoder 5 can be provided, for example, with a preselected number of the lower significant binary bits of the parallel output bits provided by counter 3. In such a case, the second decoder 6 can be provided, for example, with a preselected number of the higher significant binary bits of the parallel output bits provided by counter 3. First decoder 5 provides a decimal output signal in parallel fashion having, for example, output signals in the low (0) or OFF state corresponding to the decimal equivalent of the parallel binary input signal provided by counter 3. In comparison, second decoder 6 provides a decimal output signal in parallel fashion having, for example, output signals in the high (1) or ON state corresponding to the decimal equivalent of the parallel binary input signal provided by counter 3. It should be noted that if the forward bias direction of the visual display devices $7_1$ to $7_{MAX}$ are reversed, as discussed in detail below, the low and high decimal output states of the first decoder 5 and the second decoder 6 can be reversed. Thus, it is now apparent that the first decoder 5 and the second decoder 6 each can be one of the many commercially available parallel-to-parallel binary-to-digital decoders.

Alternately, the first decoder 5 can be provided, for example, with a preselected number of the higher significant bits of the parallel output bits provided by counter 3. In such a case, the second decoder 6 can be provided, for example, with a preselected number of lower significant bits of the parallel output bits provided by counter 3. First decoder 5 provides a decimal output signal in parallel fashion having, for example, output signals in the high (1) or ON state corresponding to the decimal equivalent of the parallel binary input signal provided by counter 3.

In comparison, second decoder 6 provides a decimal output signal in parallel fashion having, for example, output signals in the low (0) or OFF state corresponding to the decimal equivalent of the parallel binary input signal provided by counter 3. As stated above, it should be noted that if the forward bias direction of the visual display devices $7_1$ to $7_{MAX}$ are reversed, the low and high decimal output states of the first decoder 5 and the second decoder 6 can be reversed.

As stated above, the purposes of explanation, counter 3 has a five bit output capability, first decoder 5 is provided with the three lower significant bit outputs from counter 3, and second decoder 6 is provided with the two higher significant bit outputs from counter 3. The three lower significant bits are decoded by first decoder 5 into a decimal number provided on a plurality of output lines $y_1$ to $y_8$. The two higher significant bits are decoded by second decoder 6 into a decimal number provided on a plurality of output lines $x_1$ to $x_4$. As shown in FIG. 1, a plurality of visual display devices, in the form of light emitting diodes $7_1$ to $7_{32}$, are suitably connected between output lines $y_1$ to $y_8$ and output lines $x_1$ to $x_4$ at the intersections thereof. The anodes of the light emitting diodes $7_1$ to $7_{32}$ are connected to the respective output lines $x_1$ to $x_4$ because, in this case, the second decoder 6 provides decimal output signals in the high (1) or ON state while the first decoder 50 provides decimal output signals in the low (0) or OFF state. Light emitting diodes $7_1$ to $7_{32}$ can be physically arranged, for example, to define equidistant points of a straight line, as shown in FIG. 2, so as to form a display section 8.

The operation of the magnetic tape running state and tape run amount display device of the present invention which visually displays the running direction and speed of the magnetic tape is now explained.

When a tape recorder or the like having the present invention is put into the forward play mode, forward record mode or fastforward mode, the UP signal is provided to terminal 2 by the sensing circuit (not shown).

Any of these forward modes of operation results in the tape recorder rotating the tape reel, tape cassette, or the like, so as to cause the tape to be moved controllably in the forward direction. The sensing circuit (not shown), in turn, supplies a sensing pulse signal having a period corresponding to the rotation of the tape reel, tape cassette or the like to the clock terminal 1 of up-down counter 3. Because an UP signal is present on terminal 2, the up-down counter 3 successively counts up the sensing pulses supplied to terminal 1. The three lower significant bits and the two higher significant bit of the count output of the up-down counter 3 are applied to the first decoder 5 and the second decoder 6, where they are decoded into decimal numbers, respectively, as described above. If, in the present case, up-down counter 3 is in the reset state, that is, the count output is only logical zeros (0), then only output line $y_1$ of first decoder 5 is at the low or 0 level, while, in comparison, only output line $x_1$ of second decoder 6 is at the high or 1 level. As a result, only light emitting diode $7_1$ connected between output line $x_1$ and output line $y_1$ is lighted.

When the count value of the up-down counter 3 is increased by one by the application of the sensing signal, only the least significant bit output of the up-down counter 3 is changed to a logical level 1, causing only output line $yy_2$ to be at the lower logical 0 level. Thus, only the light emitting diode $7_2$ connected between output lines $x_1$ and $y_2$ is lighted, causing the lighted visual display provided by display section 8 to be shifted from light emitting diode $7_1$ to light emitting diode $7_2$.

Thus, whenever the sensing signal is applied to the up-down counter 3 and an UP signal is present on terminal 2, the count value of up-down counter 3 is increased by one. Accordingly, the lighted visual display provided by the display section 8 is shifted successively from diode $7_1$ to diode $7_2$, from diode $7_2$ to diode $7_3$ and so on up to diode $7_8$. When the second higher significant bit of the output of up-down counter 3 is changed to a logical level 1 from the logical level 0, output lines $x_2$ is changed to be at the high or 1 level and output line $x_1$ is changed to be at the low or 0 level. Thereafter, when the count value of the up-down counter 3 is increased, the light emitting diode $7_9$ through $7_{16}$ connected between the output lines $x_2$ and the output lines $y_1$ through $y_8$ are successively lighted. Accordingly, the spacial movement of the lighted visual display produced by the light emitting diodes 7 in the display section 8 corresponds to the rotation speed of the tape reel or tape cassette, i.e., the magnetic tape running speed.

When the mode of operation of the tape recorder is changed to fast-forward, the tape reel or tape cassette is rotated at a faster speed, and, therefore, the period between pulses on the sensing signal becomes shorter. Accordingly, the counting period of the up-down counter 3 becomes shorter, causing the count value of up-down counter 3 to be increased quickly. Accordingly, the spacial movement of the lighted display provided by the light emitting diodes $7_1$ through $7_{32}$ in an UP direction (for instance, to the right as viewed from the front panel of display 8) is increased. Thus, the fact that the tape recorder is in the fast-forward mode can be readily detected by the user by viewing the spacial movement direction and speed of the light emitting diodes $7_1$ through $7_{32}$ in the display section 8.

When the tape recorder is changed to a reverse mode of operation, for example, the rewind mode, the DOWN signal is provided to the terminal 2 of the up-down counter 3 by the sensing circuit (not shown).

The sensing circuit (not shown), in turn supplies a sensing pulse signal having a period corresponding to the rotation of the tape reel, tape cassette or the like to the clock terminal 1 of the up-down counter 3. Because a DOWN signal is present on terminal 2, the up-down counter 3 successively counts down the sensing pulses supplied to terminal 2.

Therefore, in the case where the count value of the up-down counter 3 is all at logical zeros, the light emitting diode $7_1$ is lighted, as was described before. However, when the first subtraction is carried out by the up-down counter 3 in response to the sensing signal applied thereto, the count value of the up-down counter 3 becomes all logical ones. As a result, the output line $y_8$ is at the low or 0 level in the first decoder 5, while the output line $x_4$ is at the high or 1 level in the second decoder 6. Thus, light emitting on diode $7_{32}$ is lighted. That is, instead of the leftmost light emitting diode $7_1$, the rightmost light emitting diode $7_{32}$ of display 8 is caused to be lighted. Thereafter, whenever the sensing signal is applied to the updown counter 3, the updown counter 3 carries out a subtraction operation, and, therefore, the spacial position of the lighted visual display is successively moved to the left in display section 8. In this rewind mode of operation, the tape is run faster, and, therefore, the period of the sensing signal becomes shorter. Accordingly, the spacial movement to the left of the lighted light emitting diodes in display section 8 becomes faster.

One example of the magnetic running and tape run amount display device of the present invention which visually displays the run amount and speed of the magnetic tape is shown in FIG. 3. Like numerals between FIGS. 1 and 3 designate like electrical elements. In the example of FIG. 3, the count capacity of the up-down counter 3 is substantially increased such that more than the total number of sensing pulses generated by the end of run of the magnetic tape on the tape reel or tape cassette can be counted. For example, if a commercially available type C-60 magnetic tape cassette is used, $2^{20}$ (i.e., 1,048,576) sensing pulses are provided by the run of the magnetic tape, which requires that up-down counter 3 have a count capacity of at least twenty bits. In addition, up-down counter of the example of FIG. 3 is provided with a reset input terminal $3a$. Counter 3 can be one of the many commercially available serial-to-parallel counters.

Up-down counter 3 is reset by applying a reset pulse to reset input terminal $3a$. For example, such a reset pulse can be provided when a completely rewound cassette is loaded in the tape recorder. Thereafter, when the tape recorder is set to the forward mode of operation, for example, the play mode, the UP signal is applied to terminal 2 of up-down counter 3. Any of the forward modes of operation resets in the tape recorder rotating the tape reel, tape cassette, or the like, so as to cause the tape to be moved controllably in the forward direction. The sensing circuit (not shown), in turn, supplies a sensing pulse signal having a period corresponding to the rotation of the tape reel, tape cassette, or the like to the clock terminal 1. The period of the sensing pulses corresponds to the rotation of the tape reel or tape cassette. Thus, up-down counter 3 successively counts up the sensing pulses supplied to the terminal 1. In the present example, the third to fifth higher bits of the count output of up-down counter 3 are applied to the first decoder 5, while the two most significant bits of the count output are applied to the second decoder 6. These bits are decoded into decimal numbers, respectively, as was described before. If up-down counter 3 is in the reset state, that is, the count output is all logical zeros, only output line $y_1$ is at low or 0 level in the first decoder 5, while only the output line $x_1$ is at the high or 1 level, causing only light emitting diode $7_1$ connected between output lines $x_1$ and $y_1$ to be lighted.

As sensing signals are applied successively to up-down counter 3, the count value of counter is successively increased. When the five higher significant bits of the count output of the up-down counter reaches a logical 1, only the output line $y_2$ is caused to have the low or 0 level in the first decoder 5. As a result, only light emitting diode $7_2$ connected between output lines $x_1$ and $y_2$ is lighted, and the light visual display in display section 8 is shifted spacially from light emitting diode $7_1$ to light emitting diode $7_2$.

Thus, whenever the sensing signal is applied to up-down counter 3, it is counted in an addition operation by counter 3. When a predetermined number of sensing signals are counted so that the count output signal of the five higher significant bits is changed, the light visual display in the display section 8 is successively shifted from diode $7_1$ to diode $7_2$, from diode $7_2$ to diode $7_3$, and so on up to diode $7_8$. When the second higher significant bit of the output of the up-down counter 3 is changed to a logical level 1 from a logical level 0, the output of the second decoder 6 is provided to the output line $x_2$ instead of the output line $x_1$. Thereafter, whenever the count value of the up-down counter 3 is increased by a predetermined value, light emitting diodes $7_9$ through $7_{16}$ connected between output line $x_2$ and output lines $y_1$ through $y_8$ respectively, are successively lighted. Accordingly, the light emitting diode 7 lighted in the display 8 corresponds to the length of tape which has run for the time interval which has elapsed from the time instant when the up-down counter 3 was reset until the readout time. If the present example is designed such that the total number of sensing pulses generated by the time the tape has completely run to the end corresponds to the full count value of up-down counter 3, then light emitting diode $7_{32}$ is lit when the tape is completely run to the end.

When the tape recorder is set in the fast-forward mode of the operation, the tape reel on tape cassette is rotated at a faster speed, and, therefore, the period of the sensing signal becomes shorter. Accordingly, the counting period also becomes shorter, and the count value of up-down counter 3 is increased at a faster rate.

Thus, the lighted display indicating the amount of run of the tape is spacially shifted at a faster rate from diode $7_1$ to diode $7_{32}$.

When the tape recorder is changed to the reverse mode of operation, for example, the rewind mode, the DOWN signal is applied to terminal 2 of up-down counter 3. As is stated above, sensing pulses are provided to terminal 1 as the tape cassette or tape reel is rotated in the reverse direction. Because of the DOWN signal on terminal 2, the up-down counter 3 carried out its DOWN counting operation whenever the sensing signal is applied thereto. As a result, in display section 8, spacial position of the lighted visual display in display 8 is shifted in the opposite direction thereby to indicate the amount of run of the tape, that is, the length of tape to be rewound, as the count value of the up-down counter 3 is decreased. In this case, if the rewind operation is begun after the up-down counter 3 is reset, the lighted visual display is provided by light emitting diode $7_1$ at the leftmost end of display 8, and is then switched to light emitting diode $7_{32}$ at the rightmost end. Thereafter, whenever the count value of the up-down counter 3 is decreased by a predetermined value, the spacial position of the lighted visual display is shifted left to successive diodes from diode $7_{31}$ to diode $7_1$.

It should be noted that in the case of both examples of the present invention where, for example, a receiver is connected to the display device, a digital signal corresponding to a receiving frequency can be applied to a plurality of input terminals 9a through 9e. For instance, in an electronic tuning type receiver in which a station selection is performed in accordance to a digital signal and the digital signal is digital-to-analog converted to obtain an analog signal, which is applied to a variable capacitance diode in the tuning section to perform the station selection, the five higher significant bits of the digital value can be applied to the input terminals 9a through 9e.

In the electronic tuning type receiver case, like the above-described two examples, the binary signal corresponded to a receiving frequency is applied to the input terminals 9a through 9e and is decoded into decimal numbers by the first and second decoders 5 and 6. Only the light diode selected with the aid of the decimal numbers is lighted so as to indicate the receiving frequency. Accordingly, if a frequency scale is provided in correspondence to the positions of the light emitting diodes $7_1$ through $7_{32}$, the receiving frequency can be readily determined from the position of a light emitting diode which is lighted.

In the above-described examples, the signal corresponding to the run or speed of the tape is obtained by measuring the rotation of the tape reel, tape cassette, etc. It should be noted, however, that the present invention is not limited thereto. That is, any signal which corresponds to the run or speed of the tape may be employed as the clock signal. Furthermore, in the above-described examples, the light emitting diodes are arranged so as to define one straight line; however, they may be arranged in the form of a circle, square, etc.

As is apparent from the above description, according to the present invention, the amount of the speed and the direction of a magnetic tape can be displayed electronically using a display device which is simple in construction, which offers ease in mounting location, and which requires only limited space. In addition, the receiving frequency of a receiver can be readily and effectively displayed by supplying the receiving frequency in digital value to the present invention.

What is claimed is:

1. A tape running state and tape run amount display device comprising:
    (a) up-down counter means responsive to a clock input signal having a pulse generated in correspondence with the run of said tape and responsive to a count control signal having an UP signal generated when said tape is being transported in a forward direction mode and having a DOWN signal generated when said tape is being transported in a reverse direction mode, said up-down counter means providing an output count signal in correspondence with said clock input signal and said count control signal; and
    (b) display circuit means responsive to said output count signal for selectively lighting a plurality of light means in correspondence to said output count signal; said output count signal from said up-down counter means is provided in binary output bit format on a plurality of lines; and
    wherein said display circuit means includes a first decoder means and a second decoder means, said first decoder means is responsive to a first preselected group of said plurality of lines having the lower significant binary output bits for binary-to-decimal converting said output bits and for providing corresponding decimal signals on a first plurality of output lines, and said second decoder means is responsive to a second preselected group of said plurality of lines having the higher significant binary output bits for binary-to-decimal converting said output bits and for providing corresponding decimal signals on a second plurality of output lines.

2. The display device as recited in claim 1 wherein said up-down counter means is responsive to a reset signal for resetting to logic 0 the count of said up-down counter means.

3. The display device as recited in claim 2 wherein said plurality of light means comprise a plurality of light emitting diodes.

4. The display device as recited in claim 2, wherein said plurality of light means comprise a plurality of light emitting diodes, one of said light emitting diodes being connected between one of said first plurality of output lines and one of said second plurality of output lines.

5. The display device as recited in claim 1 wherein said up-down counter means has a count capacity at least as large as the number of said pulses generated for the entire run of said tape.

6. The display device as recited in claim 5, wherein said plurality of light means comprise a plurality of light emitting diodes, one of said light emitting diodes being connected between one of said first plurality of output lines and one of said second plurality of output lines.

7. The display device as recited in claim 1 wherein said plurality of light means comprise a plurality of light emitting diodes.

8. The display device as recited in claim 1, wherein said first decoder means and said second decoder means are responsive to a binary decimal tuning signal provided by an electronic tuning receiver.

9. The display device as recited in claim 8, wherein said plurality of light means comprise a plurality of light emitting diodes, one of said light emitting diodes being connected between one of said first plurality of output lines and one of said second plurality of output lines.

10. The display device as recited in claim 1, wherein said plurality of light means comprise a plurality of light emitting diodes, one of said light emitting diodes being connected between one of said first plurality of output lines and one of said second plurality of output lines.

11. A display device for indicating the direction and speed of a tape in a tape recorder or playback machine, comprising, a binary up/down counter responsive to a tape direction indicating input and tape movement indicating pulses for counting said pulses in a direction depending on said direction indicating input, first diode means having $2^n$ outputs and connected to said counter and responsive to n binary bits of the count in said counter for selectively actuating one of said $2^n$ outputs, second diode means having $2^m$ outputs and connected to said counter and responsive to m binary bits of the count in said counter for selectively actuating one of said $2^m$ outputs, wherein said n binary bits are more significant bits than said m binary bits, a plurality of $2^n \times 2^m$ light emitting diodes, arranged electronically in a $2^n$ by $2^m$ matrix, and each connected to one of said first decoder outputs and one of said second decoder outputs, each said diode being illuminated when the two said outputs to which it is connected are actuated, said light emitting diodes being physically arranged adjacent one another so as to provide a visual indication of light movement corresponding to the direction of and speed of movement of said tape.

12. A display for indicating the position of a tape in a tape recorder or playback machine, comprising, a binary up/down counter responsive to a tape direction indicating input and tape movement indicating pulses for counting said pulses in a direction depending on said direction indicating input, first diode means having $2^n$ outputs and connected to said counter and responsive to n binary bits of the count in said counter for selectively actuating one of said $2^n$ outputs, second diode means having $2^m$ outputs and connected to said counter and responsive to m binary bits of the count in said counter for selectively actuating one of said $2^m$ outputs, wherein said n binary bits are more significant bits than said m binary bits, a plurality of $2^n \times 2^m$ light emitting diodes, arranged electronically in a $2^n$ by $2^m$ matrix, and each connected to one of said first decoder outputs and one of said second decoder outputs, each said diode being illuminated when the two said outputs to which it is connected are actuated, said light emitting diodes being physically arranged adjacent one another so as to provide a visual indication wherein the position of the illuminated diode relative to all non-illuminated diodes indicates the relative run position of said tape.

* * * * *